(12) United States Patent
Chia et al.

(10) Patent No.: US 10,881,036 B2
(45) Date of Patent: Dec. 29, 2020

(54) MINIMIZING OR ALLEVIATING STRESS IN A SURFACE OF A SHEET METAL STRUCTURE CAUSED BY ADDITION OF SURFACE FEATURES TO THE STRUCTURE

(71) Applicant: Cisco Technology, Inc., San Jose, CA (US)

(72) Inventors: Vic Hong Chia, Sunnyvale, CA (US); Perry L. Hayden, Sr., Magalia, CA (US); Paul Matthew Plummer, Austin, TX (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/291,715

(22) Filed: Mar. 4, 2019

(65) Prior Publication Data

US 2020/0288607 A1 Sep. 10, 2020

(51) Int. Cl.
*H05K 9/00* (2006.01)
*B21D 28/26* (2006.01)
*B21D 22/02* (2006.01)

(52) U.S. Cl.
CPC .......... *H05K 9/0026* (2013.01); *B21D 28/26* (2013.01); *B21D 22/02* (2013.01)

(58) Field of Classification Search
USPC .......... 361/816, 818, 799; 174/135, 51, 377; 343/841, 702
See application file for complete search history.

(56) References Cited

U.S. PATENT DOCUMENTS

| | | | |
|---|---|---|---|
| 6,136,131 A * | 10/2000 | Sosnowski | H05K 9/0032 156/252 |
| 6,908,005 B1 | 6/2005 | Strube et al. | |
| 7,208,675 B2 * | 4/2007 | Horng | H05K 9/0032 174/377 |
| 7,751,200 B2 * | 7/2010 | Harita | H04N 5/64 174/138 E |
| 7,944,699 B2 | 5/2011 | Taylor | |
| 8,610,003 B2 | 12/2013 | Fang et al. | |
| 2001/0051116 A1 | 12/2001 | Hornback, III et al. | |
| 2007/0065608 A1 * | 3/2007 | Niederst | B05D 7/16 428/34.1 |
| 2017/0166150 A1 * | 6/2017 | Meyers | B60R 16/0239 |

FOREIGN PATENT DOCUMENTS

WO 02/070831 A1 9/2002

OTHER PUBLICATIONS

Graham, "Understanding Oil Canning," Tech Today, Sep. 2015, 1 page.

* cited by examiner

*Primary Examiner* — Hung S. Bui
(74) *Attorney, Agent, or Firm* — Edell, Shapiro & Finnan, LLC

(57) ABSTRACT

Formation of a deformation along a surface of a sheet metal panel of an electronic device is minimized or prevented by determining an area of the surface to which a deformation has developed or is predicted to develop, where the deformation forms or is predicted to form in response to one or more of the surface features being provided into the surface. A score line is provided along the surface that is at or proximate the area.

19 Claims, 9 Drawing Sheets

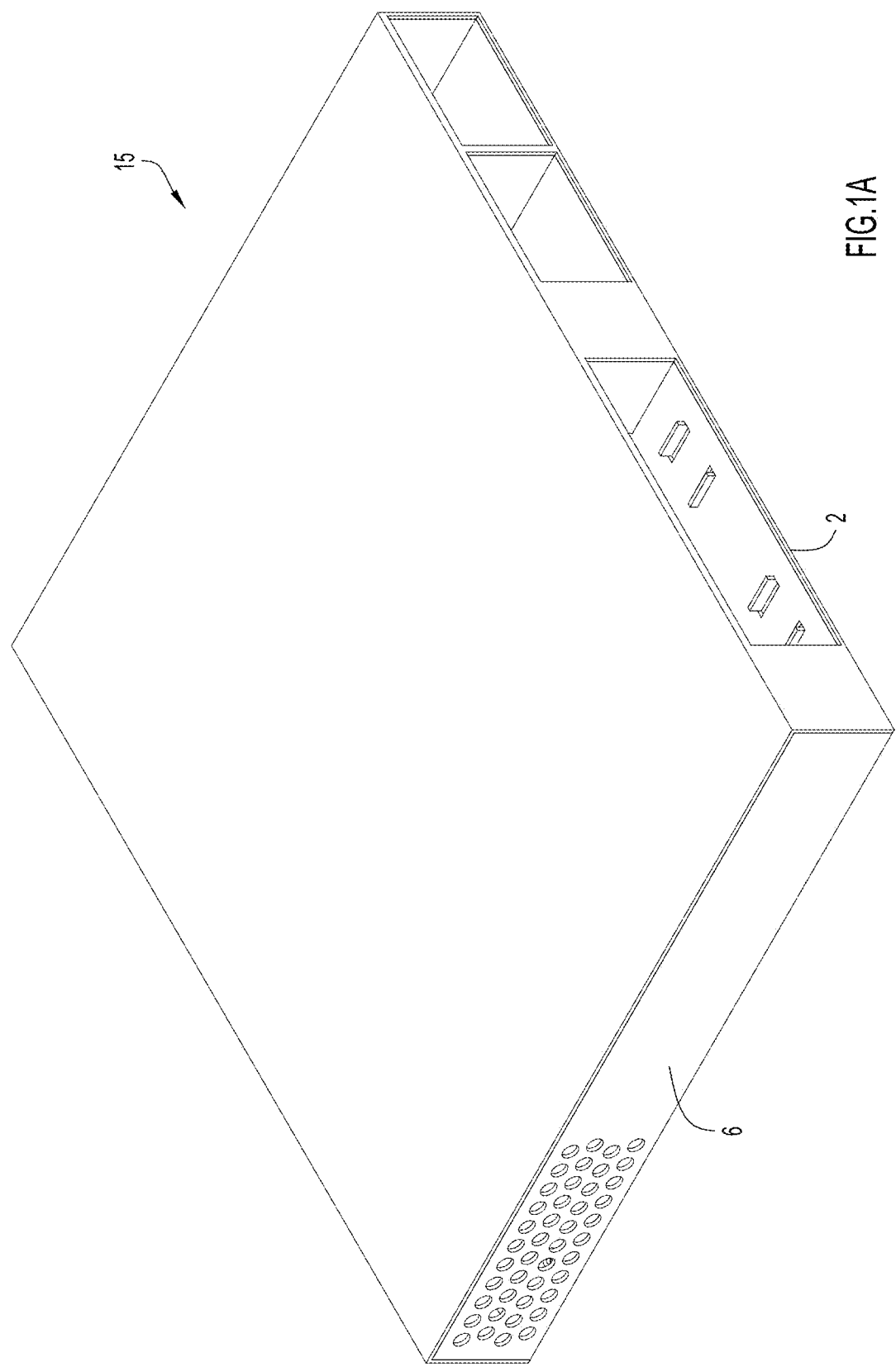

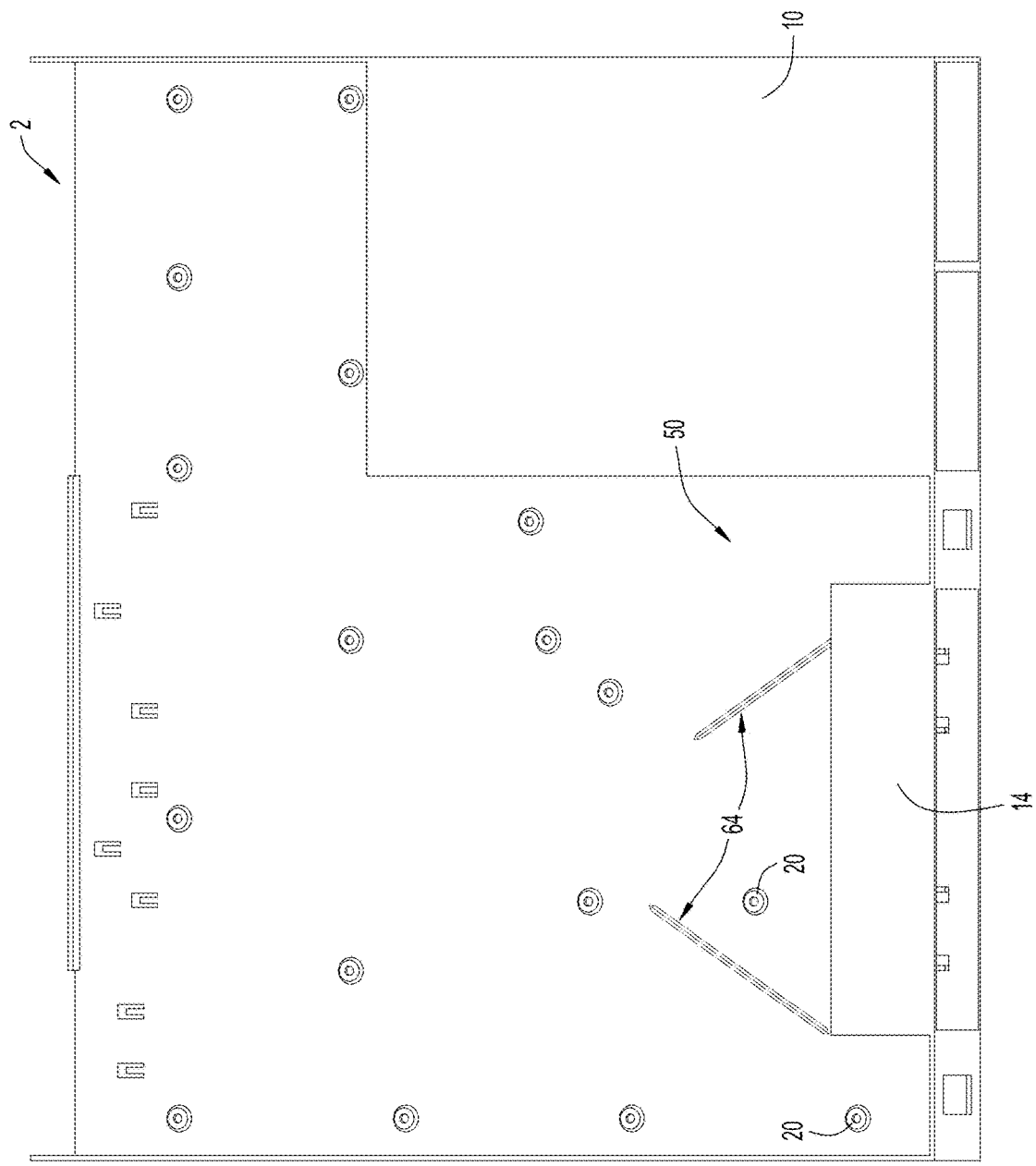

US 10,881,036 B2

MINIMIZING OR ALLEVIATING STRESS IN A SURFACE OF A SHEET METAL STRUCTURE CAUSED BY ADDITION OF SURFACE FEATURES TO THE STRUCTURE

TECHNICAL FIELD

The present disclosure relates to manufacturing of sheet metal structures and, in particular, sheet metal enclosures for electronic components.

BACKGROUND

Metal enclosures (e.g., cages or housings surrounding printed circuit board assemblies, batteries and/or other electronic components) are typically used in computer and network systems due to the good structural integrity, electromagnetic compatibility containment and easy manufacturing benefits such metal enclosures provide. In order to reduce costs associated with the addition of certain parts and features to the metal enclosure and to optimize the tooling strategy, designers typically try to insert as many features (e.g., holes, embossments, lances or tabs, forms, etc.) as possible on a given area or "real estate" of a metal surface.

BRIEF DESCRIPTION OF THE DRAWINGS

FIG. 1 depicts a top view in perspective of an example embodiment of a metal surface for an electronics enclosure structure including surface mounting features as well as deformations caused by oil canning effect.

FIG. 1A depicts a view in perspective of an enclosure for an electronics device including the enclosure structure of FIG. 1.

FIG. 5 depicts a top view in perspective of the enclosure structure of FIG. 1 including score lines added to the bottom panel surface at set locations.

DESCRIPTION OF EXAMPLE EMBODIMENTS

Overview

Figure 2:
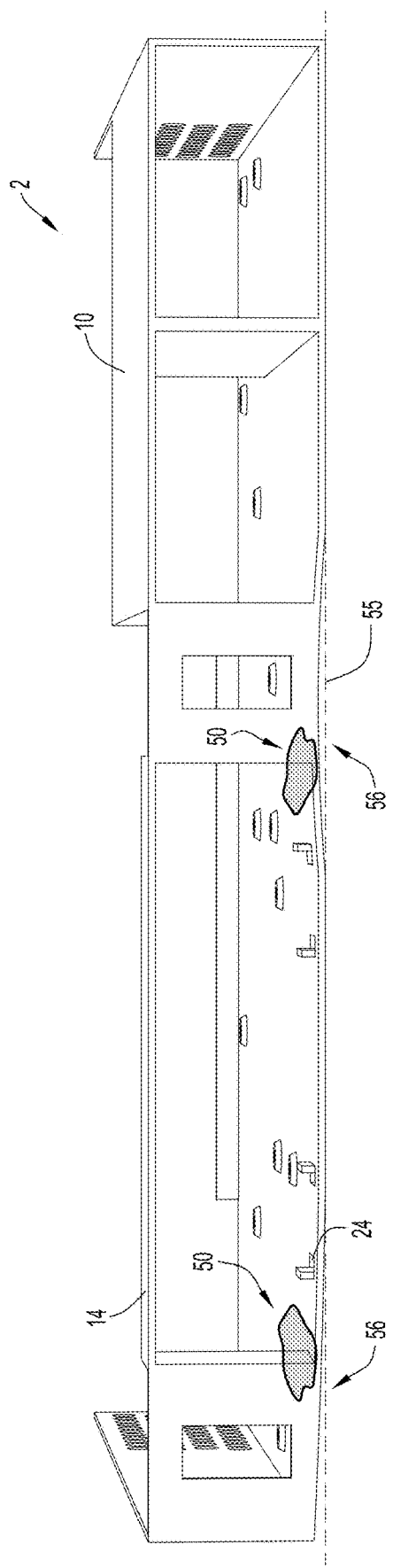
FIG. 2 depicts a side view of the enclosure structure of FIG. 1.

A method of method of minimizing stress within a sheet metal panel of an electronic device comprises providing a plurality of surface features into a surface of the sheet metal panel, determining an area of the surface that includes a deformation, where the deformation forms in response to one or more of the surface features being provided into the surface. A score line is provided along the surface that is at or proximate the area.

In addition, a method of minimizing or preventing the formation of a deformation along a surface of a sheet metal panel of an electronic device comprises determining an area of the surface to which a deformation has developed or is predicted to develop, where the deformation forms or is predicted to form in response to one or more of the surface features being provided into the surface. A score line is provided along the surface that is at or proximate the area.

Further, an enclosure for an electronic device comprises a sheet metal panel including a plurality of surface features that facilitate mounting of or connecting with one or more electronic components within the enclosure, where a surface of the sheet metal panel includes a score line that extends along the surface between at least two surface features.

Example Embodiments

A challenge presented with adding certain features to the metal surface of an enclosure is that the metal typically has a memory in which the metal surface attempts to revert back to its original surface geometry/configuration after or subsequent to being manipulated with the addition of a feature. For certain features being introduced to a metal surface, the modification to the surface typically induces some stress build up at and/or around a localized area of the feature location. This induced stress can create deformations (e.g., waviness) along surface portions, also referred to as "oil can effect" or "oil canning effect", where the deformations can be, e.g., bows or undulating/wavy or warped surface portions. While the waviness doesn't impact the structural integrity of the metal enclosure surface, it can complicate integration of a printed circuit board assembly (PCBA) and/or other components at the enclosure surface. This can lead to further complications when automation/optical assistance is used (e.g., in assembly line) to integrate components within the metal enclosure during part assembly (e.g., a deformation may distort the mounting holes of the metal to the PCBA, which can cause rejection in the automated process).

To account for the oil canning effect, some manufacturing operations have utilized flattening tools in an attempt to straighten the portion of the metal surface exhibiting deformation/waviness. However, in certain scenarios the localized stress (due to introducing certain surface features) it too great so as to render the flattening process ineffective. Another known solution is to utilize thicker gauge material for the enclosure so as to reduce or minimize the potential for stress and oil canning along the metal surface. However, this solution introduces other challenges to the manufacturing process including increased cost, increase in weight of the housing, etc. Still another known solution is to break a single large panel to multiple segments or smaller parts, and then integrate the parts into a final assembly. However, this solution increases the complexity of the manufacturing and assembly process.

Referring to FIG. 1, a metal enclosure structure 2 is depicted that forms a portion of an enclosure, a housing or a chassis for one or more electronic components. In this example, the metal enclosure structure 2 includes a bottom or base panel or wall 4 and side panels or walls 6 extending transversely (e.g., upward) from the bottom wall so as to define a partial enclosure for an electronics component. Each of the walls comprise generally planar panels formed from a suitable sheet metal material, where the metal material can be, e.g., aluminum or steel or any other suitable metal or metal alloy (or plated metal). Each sheet metal panel or wall (e.g., base wall 4 and side walls 6) can have substantially flat surfaces and a suitable thickness, e.g., a thickness ranging from about 0.6 mm to about 1.2 mm (e.g., about 0.9 mm), that is effective to support and protect the components to be housed within the enclosure while also minimizing the weight and/or bulkiness of the enclosure. It is noted that the terms "panel" and "wall" are used interchangeably herein.

The metal structure 2 can be combined in any conventional or other suitable manner with another metal structure (which includes one or more panels) to define a complete enclosure or housing for electronic components. Some examples of electronic components that can be housed within the metal structure 2 include, without limitation, one or more printed circuit board assemblies (PCBAs), hard drive components, one or more batteries (e.g., lithium ion batteries) or other power supplies, electric fans or other cooling components, etc. In an example embodiment, the metal structure 2 forms part of an enclosure or housing for a server, a switching device, a router device, a modular electronic component structure for integration with other modular components, etc. An example embodiment of a housing that entirely encloses electronic components and includes the metal structure 2 of FIG. 1 is a server housing 15 depicted in FIG. 1A.

A raised panel structure 10 extends from the base wall 4. The raised panel structure 10 can have a general U-shape so as to sub-divide the enclosure into a partial enclosure for one or more components within the raised panel structure 10. A further generally U-shaped raised panel structure 14 extends from the base wall 4 at another location and can also house other components within the enclosure.

The bottom/base panel or base wall 4 includes a number of surface features that are formed on the enclosure interior surface of the base wall 4. The surface features include raised surface contour features such as an embossment that is stamped on the surface of the panel (e.g., a raised contour portion including an indentation or opening that facilitates mounting and/or securing of or connecting with an electronic component with the panel surface), holes or openings formed through the panel (e.g., via a hole punching process), a tab or a louver that is formed on the panel surface via a lancing or piercing operation (e.g., where a portion of the panel is sheared and bent with the strike of a die so as to form a portion of the panel that is raised above or below and can further be cantilevered from a surrounding surface portion of the panel), an opening, a vent, a slot and any other form or raised structure defined along the panel surface via a suitable tooling operation. At least one of the surface features is configured to connect with and/or facilitate mounting of an electronic component with the panel so as to secure the electronic component to the panel within the enclosure. In the example embodiment of FIGS. 1 and 2, some surface features depicted along the surface of the base wall 4 include raised embossments 20, lances or tabs 22 and 24, holes or openings and slots or any other surface connecting structure, where the surface features are configured to provide a mounting and/or connection between the base wall 4 and electronic and/or other components (e.g., a PCBA) as well as the raised panel structures 10, 14.

Given the gauge or thickness as well as the type(s) of metal materials typically being chosen so as to form the panels or walls of the enclosure for the electronic device, the introduction or providing of certain types of surface features to an enclosure wall surface (e.g., the base wall 4 of enclosure structure 2) can result in deformations or slight buckling of the otherwise relatively flat wall due to induced stress to the metal surface that is caused by the fabrication of the surface features. The oil canning effect or induced stress at certain areas of the metal surface can be increased or intensified when the number of surface features within a given area of the metal surface are increased. In particular, to reduce the cost of requiring additional parts for a metal enclosure and to optimize tooling strategies so as to maximize the real estate for a given metal surface area, as many surface features as possible are typically provided within a given area. This can lead to the detrimental effect of oil canning at such areas, with the flat surface of a metal wall becoming deformed (e.g., bowed, warped or wavy) at localized areas including large numbers of surface features.

Referring again to FIGS. 1A and 2, oil canning effect deformation areas are shown generally as shaded areas 50 at certain locations along the enclosure interior surface of the base wall 4 (where the shaded areas 50 represent a slight contour change, such as a slightly raised or elevated contour or a slight depression, along the otherwise substantially flat surface of the base wall). The oil canning effect areas 50 (locations at which the base wall 4 is slightly deformed so as to have a slight wavy or buckled surface at such locations) result in the base wall 4 no longer being substantially planar and flat, as is evident at locations 56 as depicted in FIG. 2 (where an imaginary dashed line 55 represents a flat or planar surface, and it can be seen that the base wall 4 slightly deforms or buckles from the dashed line 55 at the areas 56 while other portions of the base wall 4 are substantially coplanar with dashed line 55). While the base wall 4 is still relatively planar and flat, at the areas 56 the base wall 4 is slightly wavy or warped (i.e., the contour changes to form slightly convex or slightly concave areas along the surfaces of the base wall). Even though this deformation may be slight and would not affect the structural integrity of the base wall or the enclosure within which the wall is integrated, it can negatively impact the integration of components such as PCBAs with the base wall (i.e., utilizing the surface features to connect components to the base wall) during a electronic device manufacture process (in particular an automated process in which optical sensors are utilized to properly align enclosure walls with components for connection).

In accordance with embodiments described herein, it has been determined that the introduction or providing of one or more score lines or grooves within the surface of the metal panel or wall at or proximate an area where an oil canning deformation is present (or is likely to develop) minimizes, alleviates or prevents the oil canning effect or deformation along the surface that is or may be caused by the introduction of surface features along the metal wall surface. A scoring tool or any other suitable device can be utilized to introduce or provide one or more scoring lines or grooves in the surface of the enclosure wall. Selection of a location for a scoring line can be based upon a number of factors including, without limitation, observation of a deformation within the surface after or subsequent to one of more surface features have been formed in the surface, further observation after or subsequent to the addition of one or more prior score lines to determine whether the deformation has diminished in size, and predictive introduction of one or more score lines at one or more specific areas (e.g., prior to the addition of a surface feature and/or based upon knowledge of a particular pattern of surface features that tend to cause an oil canning effect/surface deformation at the specific area(s)).

Figure 3:
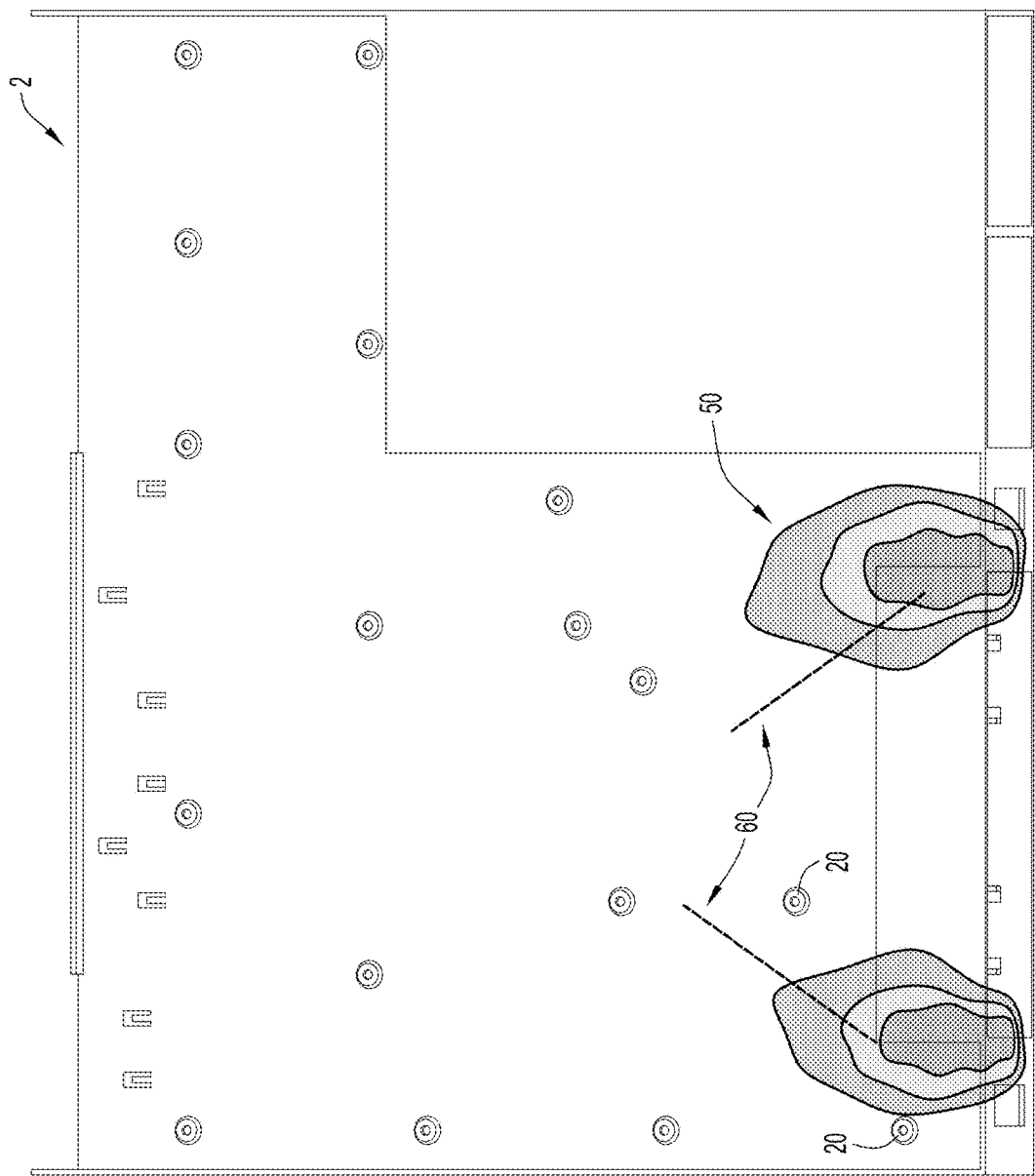
FIG. 3 depicts the same top view in perspective of the enclosure structure of FIG. 1 and further including possible locations for score lines to be provided to minimize or reduce oil canning effect deformations along a bottom wall surface of the enclosure structure.
Figure 4A:
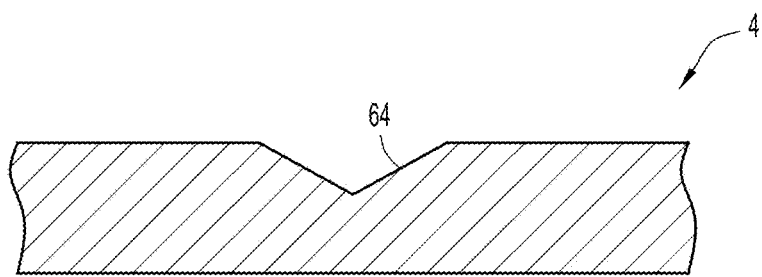
FIGS. 4A-4C depict cross-sectional side views of a portion of the bottom wall for the enclosure structure of FIG. 3 that includes a score line, where the figures present examples of different cross-sectional shapes for the score line.
Figure 4B:
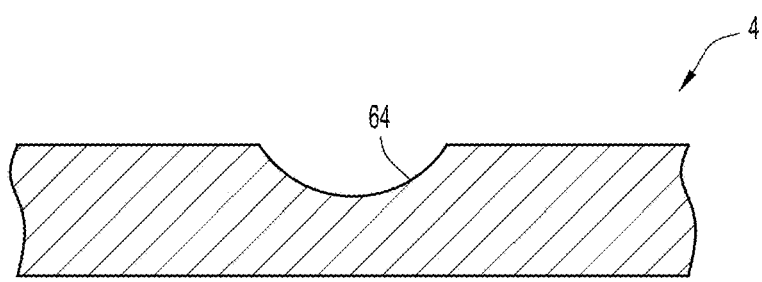
Figure 4C:
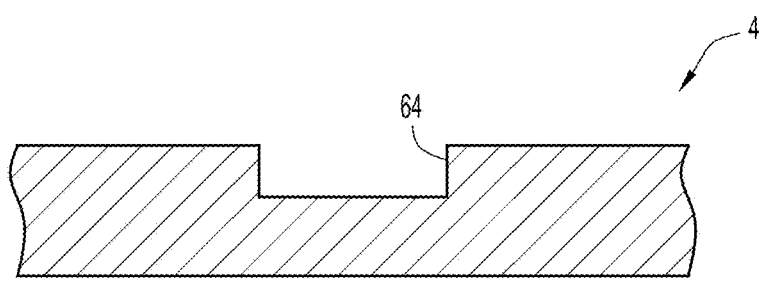

Referring to FIG. 3, the dashed lines 60 represent locations where a score line can be introduced to reduce stress along the base wall surface so as to diminish or remove the deformations at the oil canning effect areas 50. The dimensions of a score line, including length, width and depth, as well as geometry of the score line (e.g., straight line, curved or bowed line, jagged line) can be determined for a particular application, depending upon the nature of the stress or stresses in the wall surface that cause the oil canning effect/deformation along the wall surface. The cross-sectional geometry or shape of a score line can also be selected for a particular application based upon the nature of the stresses to the wall surface caused by the introduction of surface features as well as the type of tooling utilized to form the score along the wall surface. Referring to FIG. 4A, which depicts a portion of the base wall 4 in cross-section, a score line 64 in the wall 4 has a general V-shape in cross-section (i.e., the score line has a width that decreases in cross-sectional dimension as a depth of the score line increases within the surface of the sheet metal panel or wall). Other examples of score line cross-sectional geometries are depicted in FIGS. 4B and 4C, where the score line may have a generally rounded or concave cross-sectional shape or a square cross-sectional shape. Score lines can also have other cross-sectional shapes.

Two or more score lines can be combined at a specific area along the wall surface so as to form a pattern that may further enhance alleviation of stress at the wall surface (caused by the introduction of one or more surface features in the vicinity or in close proximity to the area in which an oil canning effect deformation forms in the wall surface). For example, two score lines can intersect with each other (e.g., to form an "X" pattern) or be presented in close proximity (e.g., parallel) with each other without intersecting. In other embodiments, two or more score lines can combine or connect with each other to form any geometric pattern that provides stress relief to reduce, minimize or eliminate an oil canning effect deformation within the wall surface. Referring again to FIG. 3, the dashed lines 60 extend at least partially through the areas 50. In other words, a score line can be introduced that extends at least partially through an area of the wall surface in which an oil canning effect deformation is formed or may be formed. Alternatively, a score line can be provided in proximity but not located within an area of the wall surface in which an oil canning effect deformation is formed or may be formed. A score line also can be provided that extends along an area of the wall surface that is between two or more surface features. For example, each of the dashed lines 60, which represent locations for the formation of score lines, has a sufficient length so as to extend along the surface of the base wall 4 to be between two or more raised embossments 20.

The score line depth should be sufficient to ensure alleviation or reduction of the stress or stresses caused by the introduction of surface features at the wall surface while at the same time ensuring the strength and integrity of the wall at the score line is not weakened but instead is sufficient to prevent bending, tearing or fracturing of the wall at the score line. In other words, the score lines described herein do not extend so far into the wall thickness to provide a weakened folding line or a perforation or tear line for separation of the wall into two or more pieces. The score lines described herein have a depth that is no greater than about half the thickness of the sheet metal panel or wall, preferably no greater than about ⅓ the thickness of the sheet metal panel or wall. As previously noted herein, the sheet metal material used to form panels or walls of an electronics enclosure typically have thickness dimensions in the range of about 0.6 mm to about 1.2 mm (e.g., about 0.9 mm). Accordingly, the depth of a score line within the surface of the panel or wall should be no greater than about 0.3 mm (for a 0.6 mm wall thickness) to about 0.6 mm (for a 1.2 mm wall thickness), preferably no greater than about 0.2 mm (for a 0.6 mm wall thickness) to about 0.4 mm (for a 1.2 mm wall thickness). For a 0.9 mm wall thickness, a score line should have a depth no greater than about 0.45 mm, preferably no greater than about 0.3 mm.

Referring to FIG. 5, score lines 64 are introduced (utilizing a suitable scoring tool) to the surface of the base wall 4 and corresponding with the dashed lines 60 in FIG. 3. The score lines 64 have sufficient lengths so as to extend between at least two surface features (e.g., extending between at least two raised embossments 20) and further have a V-shaped cross-sectional shape (e.g., similar to the shape depicted in FIG. 4A). The score lines 64 further extend at least partially through areas where oil canning effect deformations are located (e.g., where each area encompasses a corresponding oil canning effect deformation).

Figure 6:
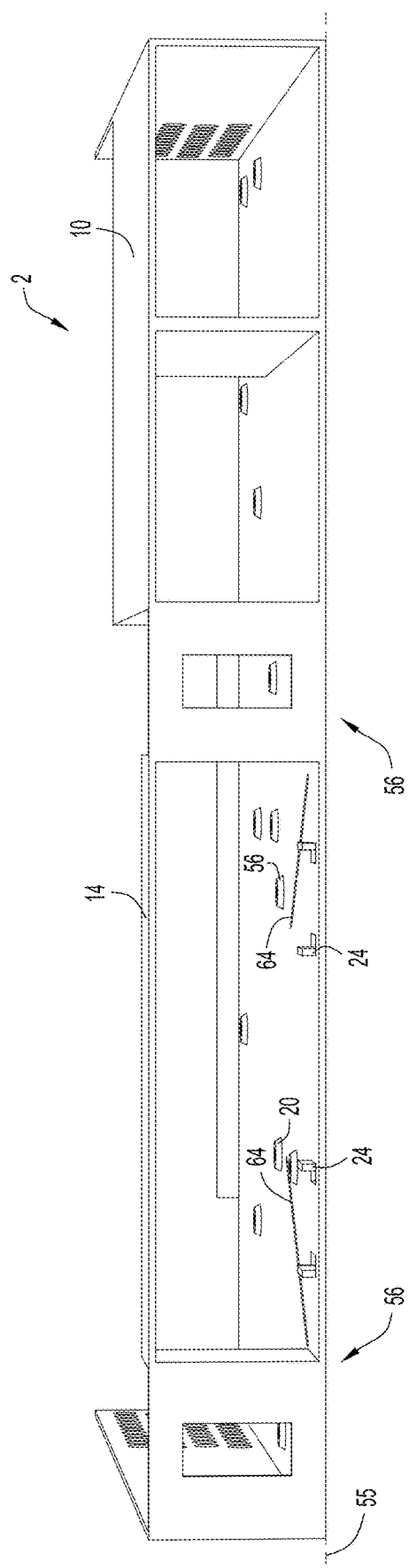
FIG. 6 depicts a side view of the enclosure structure of FIG. 5.

FIG. 6 depicts a side view of the enclosure structure 2, where score lines 64 have been introduced into the base wall 4 as depicted in FIG. 5. The oil can deformations at areas 50 have been diminished or eliminated, due to the introduction of the score lines 64 at the designated locations along the base wall 4, such that the base wall 4 is now substantially free of deformations at areas 50. This is evident from the restoration of the base wall 4 to a substantially planar and flat configuration, where wavy or buckled surface area locations (e.g., locations 56 as depicted in FIG. 2) are diminished or removed due to the alleviation of stresses in the metal base wall (as a result of the introduction of the score lines 64 to the base wall 4).

An example method of minimizing or alleviating stress in the surface of a sheet metal structure caused by the addition of surface features to the surface of the sheet metal structure (resulting in oil canning effect deformations in the sheet metal surface) is now described with reference to FIGS. 1-6 and the flowchart of FIG. 7A. At 102, surface features (e.g., embossments, lances or tabs, holes and/or slots) are introduced into a sheet metal panel or wall surface, such raised embossments 20, lances or tabs 22, etc. into the base wall 4 (as depicted in FIGS. 1 and 2). The introduction of a selected number of surface features at different locations along the panel surface (e.g., with some surface features being in close proximity with each other) results in stresses induced into the sheet metal panel and resultant oil canning effect deformations (e.g., waviness) along localized surface area portions of the panel (e.g., areas 50 along the surface of base wall 4).

At 104, the locations of oil canning effect deformations are determined. This determination can be based upon a visual inspection by a manufacturer. Alternatively, the determination can be made automatically via the use of optical sensors that determine a change in surface contour along the panel surface during various stages of fabrication of the enclosure. In response to determination of one or more locations along the panel surface that include one or more oil canning effect deformations, one or more score lines are introduced into the panel surface at 106. A score line can be introduced or formed within the panel surface manually (e.g., via a manufacturer using a suitable scoring tool) or automatically (e.g., utilizing an automated scoring process). The number, location(s) and dimensions of each score line formed within the panel surface can be selected based upon a particular application as well as the nature and severity of each oil canning deformation that develops along the panel surface. For example, as depicted in FIGS. 4-6, a score line 64 is introduced at or proximate each area 50 along the surface of the base wall 4 that includes an oil canning effect deformation, where the score line extends through at least partially through the area encompassing the oil canning effect deformation and/or extends between at least two surface features (between at least two raised embossments 20).

At 108, the effect of the score lines is observed (either visually by a manufacturer or automatically via optical sensors that measure/monitor surface contour at locations along the panel surface), and at 110 a determination (manually or automatically) is made whether to introduce any further score line(s) such that further score lines are optionally introduced based upon the determination. In particular, a size of the oil canning deformation can be determined (e.g., manually or automatically) before and after or subsequent to the addition of one or more score lines, and a determination can be made regarding whether to provide a further score line that is at or proximate the area in response to observing that the deformation has not been reduced to a determined size (e.g., reduced to an acceptable contour tolerance for the panel surface) after or subsequent to providing the initial score line. For example, further score lines may be introduced or formed along surface locations of the panel surface if it is determined that any oil canning effect deformation has not been sufficiently minimized (i.e., the panel surface has not been sufficiently restored to a desired flat or planar configuration, or to a desired contour that meets an acceptable tolerance for the panel surface, such that there is still an undesired level of waviness at the oil canning effect deformation area). In the embodiment depicted in FIGS. 5 and 6, if it is determined that the base wall 4 still has an undesired surface contour (e.g., still too warped or wavy) at areas 56, further score lines can be introduced (e.g., further score lines that intersect score lines 64). This process can be repeated as necessary to eventually alleviate or eliminate stress within the base wall 4 such that the warping or waviness at areas 56 are sufficiently minimized or eliminated (e.g., the areas 56 base wall 4 are restored to a relatively flat or planar contour as depicted in FIG. 6, where the base wall 4 extends substantially flat and coplanar with dashed line 55).

Figure 7A:
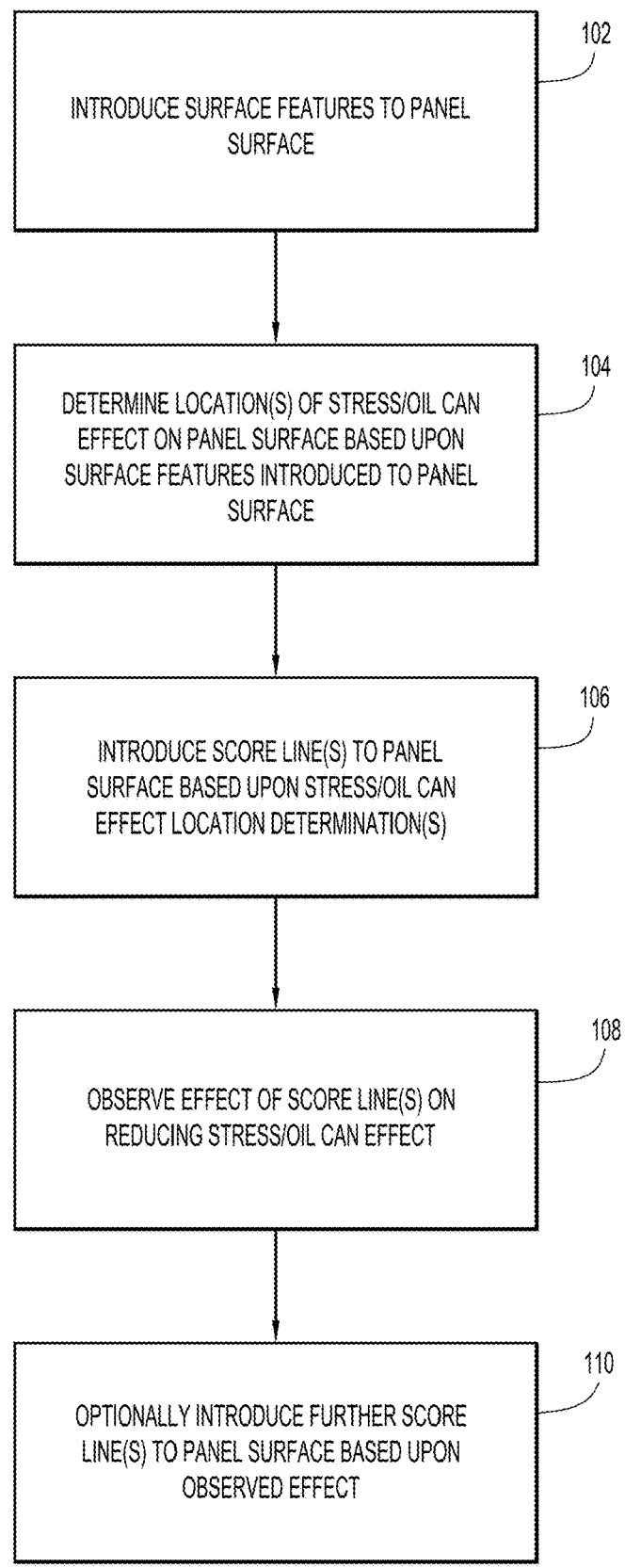
FIGS. 7A and 7B are flowcharts describing example methods in accordance with the present embodiments for reducing stress and oil canning effect on a panel surface of the enclosure structure having surface features introduced thereon.

The example process of FIG. 7A is based upon observation of oil canning effect deformations that are already present in the panel surface after or subsequent to introduction of surface features. In other words, the process of adding score lines is in response to stresses already being induced in the panel surface to generate undesired wavy or warped contours within the panel. In alternative embodiments, one or more score lines can also be introduced prior to the introduction of an oil canning effect deformation within the panel surface. In other words, one or more score lines can be added on a predictive basis, where an oil canning effect deformation might be anticipated or expected based upon a particular application. For example, in an embodiment in which a base panel or wall is fabricated in a production assembly line where a precise pattern of surface features are introduced into a surface of the base wall that is known (e.g., by production repetition) to induce one or more oil canning effect deformations along the base wall surface, one or more score lines can be introduced prior to introduction of at least some of the surface features and prior to formation of oil canning effect deformations. The score lines can be added in a predictive manner at precise areas along the base wall surface and having suitable geometries (e.g., suitable lengths, widths, depths, and cross-sectional shapes) that have been predetermined to alleviate stress that would otherwise be imparted to the base wall surface and otherwise form such oil canning deformations as a result of the surface feature formations.

Figure 7B:
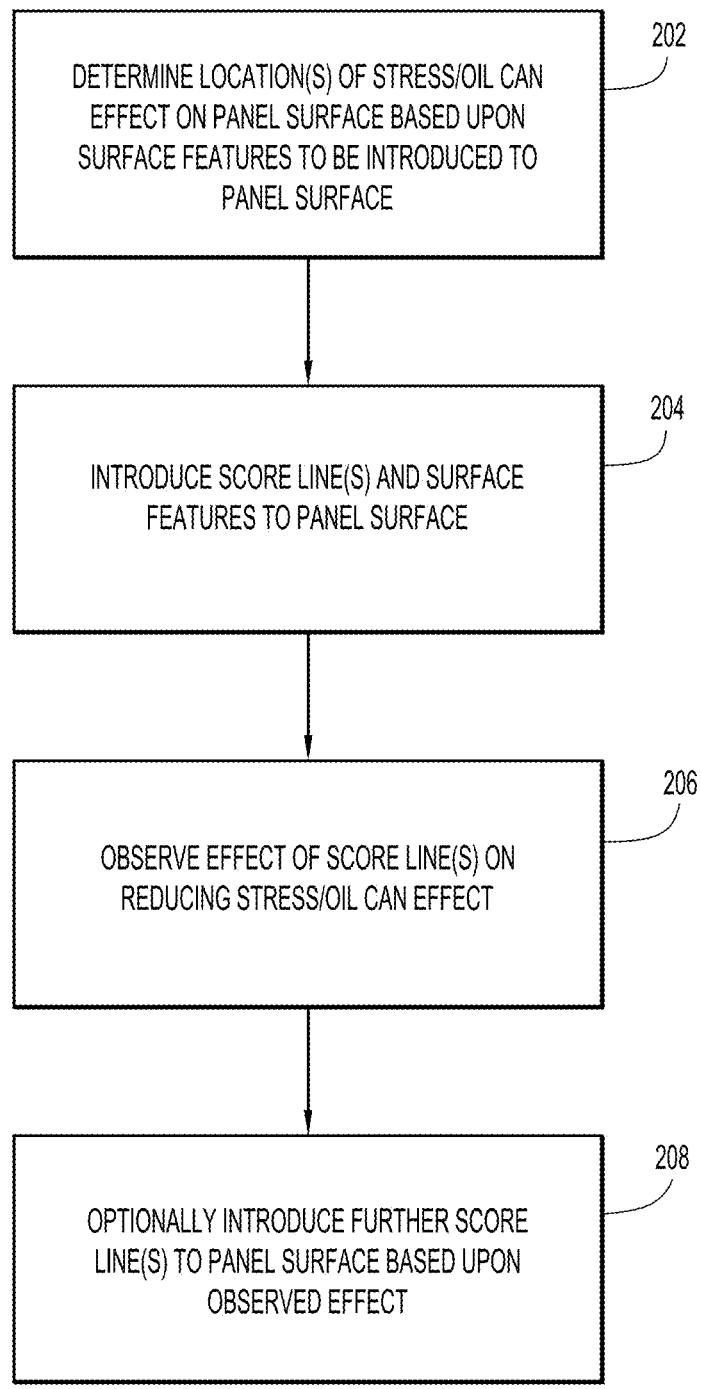

A predictive introduction of scoring lines to a surface of a panel forming part of an enclosure for an electronics device is now described with reference to the flowchart of FIG. 7B. At 202, one or more locations along a panel or wall surface are determined that correspond with where stresses and resultant oil canning effect deformations can occur due to the introduction of surface features (e.g., embossments, lances or tabs, holes and/or slots) into the panel surface. At 204, one or more scoring lines and surface features are introduced or formed into the panel surface at or proximate an area where an oil canning deformation is predicted to form (based upon the addition of one or more surface features to the panel surface). Each scoring line can be introduced prior to, at about the same time, or subsequent to the formation of surface features along the panel surface. If a scoring line is introduced subsequent to the formation of a surface feature, the scoring line is added within a suitable time period between when the surface feature is added and before enough stress is induced within the panel to form an oil canning effect deformation. Preferably, the score lines are introduced either prior to or at about the same time as one or more surface features to the panel surface.

At 206, and after formation of at least one surface feature to the panel surface, the effect of the score lines is observed (either visually by a manufacturer or automatically via optical sensors that measure/monitor surface contour at locations along the panel surface), and at 208 a determination (manually or automatically) is made whether to introduce any further score line(s), such that further score lines are optionally added based upon the determination.

The processes and resultant electronic devices described herein facilitate alleviation, minimization, removal and/or prevention of oil canning deformations caused by formation of surface features to the surface of a panel or wall of an enclosure for an electronic device. The score lines can be introduced before, during and/or after or subsequent to formation of surface features within the panel surface such that the score lines prevent the formation of oil canning deformations (e.g., when the score lines are added prior to or at about the same time that surface features are added) or to minimize or remove oil canning deformations (when the score lines are added after deformations are formed). For example, one or more surface features can be introduced or provided after or subsequent to introducing or providing one or more score lines in and along the surface of the panel or wall.

Thus, an example embodiment of a method of minimizing stress within a sheet metal panel of an electronic device comprises providing a plurality of surface features into a surface of the sheet metal panel, determining an area of the surface that includes a deformation, where the deformation forms in response to one or more of the surface features being provided into the surface. A score line is provided along the surface that is at or proximate the area.

Each surface feature of the plurality of surface features can comprise an embossment, a tab, an opening, a vent, a louver or a slot.

The example method can further comprise providing a further score line that is at or proximate the area in response to observing that the deformation has not been reduced to a determined size after providing the score line.

The score line can extend at least partially through the area. The score line can also extend between at least two surface features of the plurality of surface features.

The sheet metal panel can have a thickness ranging from about 0.6 mm to about 1.2 mm.

The score line can have a depth that is no greater than about half a thickness of the sheet metal panel, or that is no greater than about ⅓ a thickness of the sheet metal panel. In addition, the score line can have a width that decreases in cross-sectional dimension as a depth of the score line increases within the surface of the sheet metal panel.

At least one of the surface features can be configured to connect with an electronic component. An electronic component can comprise a printed circuit board assembly (PCBA). Further, the electronic device can comprise a server.

An example embodiment of a method of minimizing or preventing the formation of a deformation along a surface of a sheet metal panel of an electronic device comprises determining an area of the surface to which a deformation has developed or is predicted to develop, where the deformation forms or is predicted to form in response to one or more of the surface features being provided into the surface. A score line is provided along the surface that is at or proximate the area.

An example embodiment of an enclosure for an electronic device comprises a sheet metal panel including a plurality of surface features that facilitate mounting of one or more electronic components within the enclosure, where a surface of the sheet metal panel includes a score line that extends along the surface between at least two surface features.

The above description is intended by way of example only. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of minimizing stress within a sheet metal panel of an electronic device, the method comprising:
   providing a plurality of surface features into a surface of the sheet metal panel, wherein the surface features comprise connecting structures that facilitate a mounting connection between one or more electronic components and the surface of the sheet metal panel;
   determining an area of the surface that includes a deformation, wherein the deformation comprises a change in surface contour of the sheet metal panel that forms in response to the one or more of the surface features being provided into the surface; and
   providing a score line along the surface that is at or proximate the area.

2. The method of claim 1, wherein each surface feature of the plurality of surface features comprises an embossment, a tab, an opening, a vent, a louver or a slot.

3. The method of claim 1, further comprising:
   providing a further score line that is at or proximate the area in response to observing that the deformation has not been reduced to a determined size after providing the score line.

4. The method of claim 1, wherein the score line extends at least partially through the area.

5. The method of claim 1, wherein the score line extends between at least two surface features of the plurality of surface features.

6. The method of claim 1, wherein the sheet metal panel has a thickness ranging from about 0.6 mm to about 1.2 mm.

7. The method of claim 1, wherein the score line has a depth that is no greater than about half a thickness of the sheet metal panel.

8. The method of claim 1, wherein the score line has a depth that is no greater than about ⅓ a thickness of the sheet metal panel.

9. The method of claim 1, wherein the score line has a width that decreases in cross-sectional dimension as a depth of the score line increases within the surface of the sheet metal panel.

10. The method of claim 1, wherein the one or more electronic components comprises a printed circuit board assembly (PCBA).

11. The method of claim 10, wherein the electronic device comprises a server.

12. A method of minimizing or preventing formation of a deformation along a surface of a sheet metal panel of an electronic device, the method comprising:
    determining an area of the surface to which a deformation has developed or is predicted to develop, wherein the deformation comprises a change in surface contour of the sheet metal panel that forms or is predicted to form in response to one or more surface features being provided into the surface, and wherein each surface feature comprises a connecting structure that facilitates a mounting connection between one or more electronic components and the surface of the sheet metal panel; and
    providing a score line along the surface that is at or proximate the area.

13. The method of claim 12, further comprising:
    providing a plurality of surface features into the surface of the sheet metal panel prior to providing the score line along the surface.

14. The method of claim 12, further comprising:
    providing a plurality of surface features into the surface of the sheet metal panel subsequent to providing the score line along the surface.

15. The method of claim 14, wherein each surface feature of the plurality of surface features comprises an embossment, a tab, an opening, a vent, a louver or a slot.

16. The method of claim 12, wherein the score line extends at least partially through the area.

17. The method of claim 12, wherein the score line extends between at least two surface features being provided into the surface.

18. The method of claim 12, wherein the one or more electronic components comprises a printed circuit board assembly (PCBA).

19. The method of claim 18, wherein the electronic device comprises a server.

* * * * *